(12) United States Patent
Thoai-Thai

(10) Patent No.: US 6,369,607 B2
(45) Date of Patent: Apr. 9, 2002

(54) DIGITAL CIRCUIT

(75) Inventor: Le Thoai-Thai, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/803,430

(22) Filed: Mar. 9, 2001

Related U.S. Application Data

(63) Continuation of application No. PCT/DE99/02739, filed on Sep. 1, 1999.

(51) Int. Cl.$^7$ ................................................. G06F 7/38
(52) U.S. Cl. .............................. 326/38; 326/37; 326/93; 326/113
(58) Field of Search ............................. 326/37, 38, 83, 326/93, 95, 104, 113, 112

(56) References Cited

U.S. PATENT DOCUMENTS

| | | | |
|---|---|---|---|
| 4,978,867 A | * | 12/1990 | Pfennings ................. 307/296.6 |
| 5,144,168 A | | 9/1992 | Tran |
| 5,306,970 A | | 4/1994 | Phillips |
| 5,498,988 A | * | 3/1996 | Reyes et al. ................. 327/199 |

* cited by examiner

*Primary Examiner*—Michael Tokar
*Assistant Examiner*—Anh Tran
(74) *Attorney, Agent, or Firm*—Herbert L. Lerner; Laurence A. Greenberg; Werner H. Stemer

(57) ABSTRACT

A digital circuit is described which has an input for supplying an input signal through a switching element and an activation input by which it can be switched to an activated or deactivated state. The circuit also contains a first output supplying in a non-inverted manner in the activated state the level of the input signal immediately before switching the switching element to a non-conducting state and a second output supplying in an inverted manner the level of the input signal immediately before switching the switching element to the non-conducting state. In the deactivated state, it furnishes a first logical level to both outputs. The circuit also has a logical unit that is connected to both outputs on the input side and to a control connection of the switching element on the output side. The logical unit switches the switching element to a conductive state, when the first logical level is applied on both outputs. It switches the switch element to a non-conducting state, when a second logical level is applied one of the outputs.

5 Claims, 2 Drawing Sheets

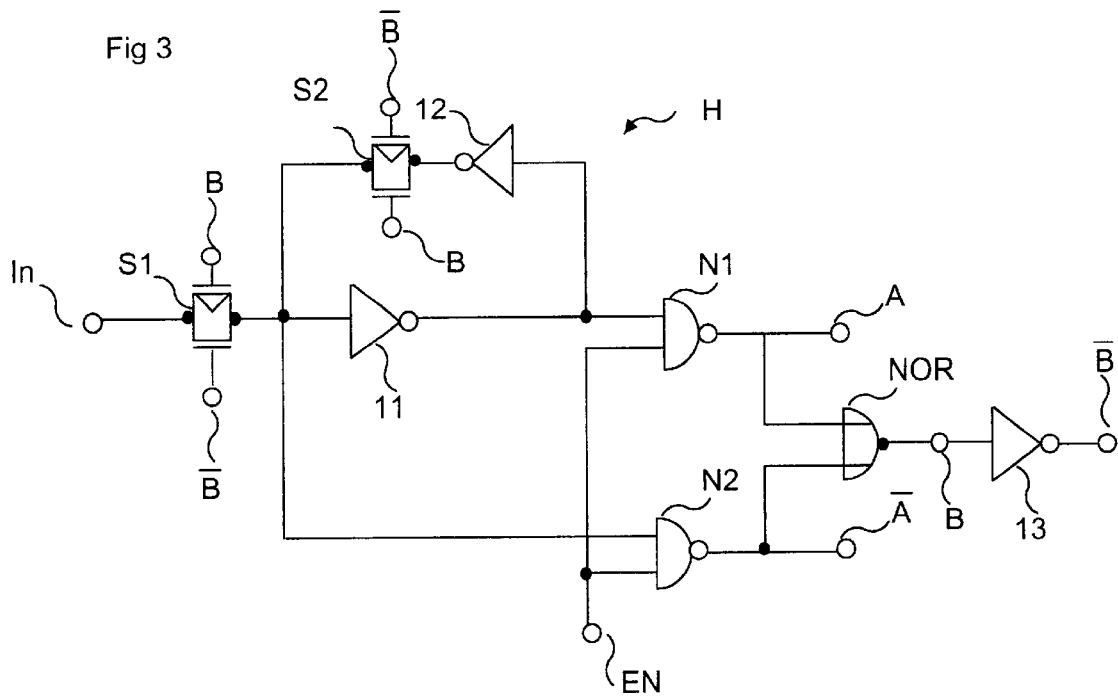
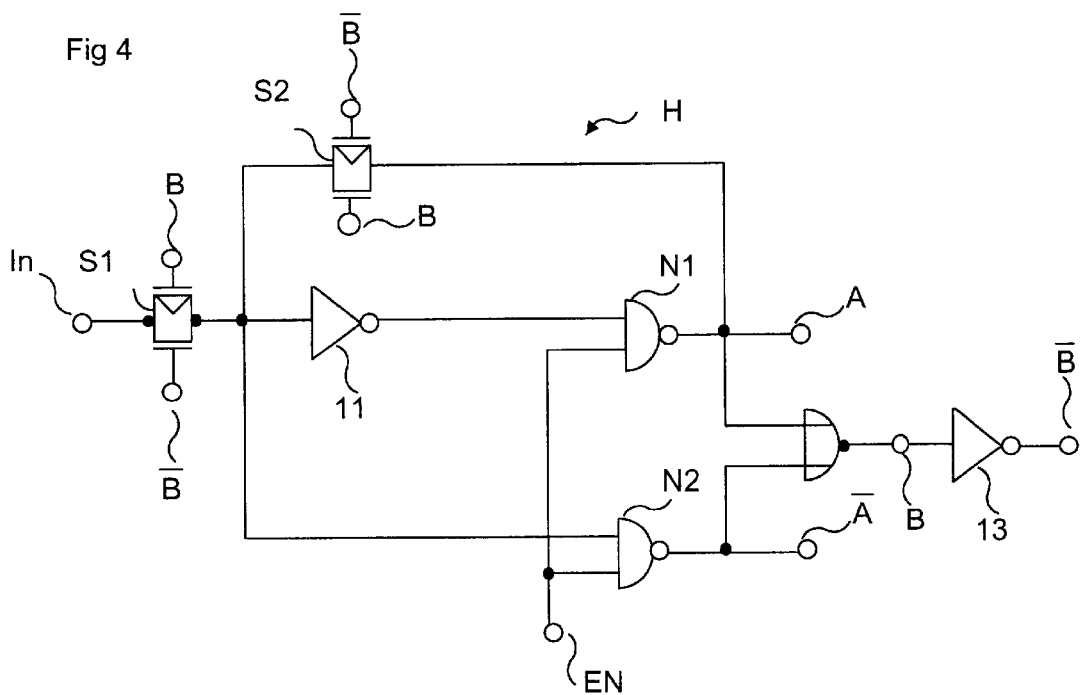

DIGITAL CIRCUIT

CROSS-REFERENCE TO RELATED APPLICATION

This application is a continuation of copending International Application No. PCT/DE99/02739, filed Sep. 1, 1999, which designated the United States.

BACKGROUND OF THE INVENTION

FIELD OF THE INVENTION

The present invention relates to a digital circuit. U.S. Pat. No. 5,144,168 discloses a digital circuit with an input for supplying an input signal through a first switching element. The digital circuit further has an activation input via which the circuit can be set to an activated state and a deactivated state, a first output, a second output and a logic unit. The logic unit is connected on the input side to the two outputs of the circuit and is connected on the output side to a control connection of the first switching element. The logic unit switches the first switching element to a conductive state when there is a first logic level at the two outputs of the circuit, and the logic unit blocks the first switching element when there is a second logic level at one of the two outputs.

SUMMARY OF THE INVENTION

It is accordingly an object of the invention to provide a digital circuit that overcomes the above-mentioned disadvantages of the prior art devices of this general type, which, after being set to an activated state, outputs an input signal in a non-inverted state and in an inverted state to corresponding outputs and which, after its activation, permits a favorably timed decoupling from the input signal as soon as the level of the latter has been sensed.

With the foregoing and other objects in view there is provided, in accordance with the invention, a digital circuit, containing a switching element having a control terminal and an input for receiving an input signal and connected to the switching element, the input supplying the input signal to the switching element. An activation input receives an activation signal for setting an activated state and a deactivated state. Two output points including a first output point and a second output point are provided. A logic unit has inputs connected to the two output points and an output connected to the control terminal of the switching element. The logic unit switches the switching element to a conducting state if there is a first logic level at the two output points. The logic unit switches the switching element to a non-conducting state if there is a second logic level at one of the two output points. A circuit unit is connected to the activation input, the switching element, and the inputs of the logic unit. In the activated state, the first output point outputs in a non-inverted form a level of the input signal which the input signal has directly before the setting of the switching element to the non-conducting state. In the activated state, the second output point outputs in an inverted form the level of the input signal which the input signal has directly before the setting of the switching element to the non-conducting state. And in the deactivated state, the first logic level is output at both of the two output points.

The digital circuit according to the invention has the input for supplying the input signal via the first switching element and also the activation input, by which it can be set to an activated state and a deactivated state. Furthermore, it has a first output, at which, in the activated state, it outputs in a non-inverted form that level of the input signal which the latter has directly before a blocking of the first switching element, and a second output, at which, in the activated state, it outputs in an inverted form that level of the input signal which the latter has directly before the blocking of the first switching element. In the deactivated state, it outputs a first logic level at both outputs. In addition, the digital circuit has the logic unit, which is connected on the input side to the two outputs of the circuit and which is connected on the output side to a control connection of the first switching element. The logic unit switches the first switching element to a conductive state when the first logic level is present at both outputs of the circuit. The logic unit sets the first switching element to a non-conducting state (blocking) when a second logic level is present at one of the two outputs.

Consequently, as long as the digital circuit is deactivated, the circuit outputs the same logic level at both of its outputs, whereby the first switching element is switched to the conductive state via the logic unit. Therefore, during this time period, the input signal at the input of the digital circuit is connected through the first switching element to further components of the digital circuit. The level of the input signal in this case does not have any effect on the output signals of the digital circuit. As soon as the digital circuit is set to the active state via its activation input, the signals at both the outputs of the digital circuit are complementary to each other. Which level the two output signals have is dependent on the level of the input signal at the change to the activated state. By monitoring the output signals, the logic unit detects from their different levels that the digital circuit is in the activated state and that the currently applicable level of the input signal was output to the first output in a non-inverted form and to the second output in an inverted form. At this point in time, the logic unit puts the first switching element in a non-conducting state, so that subsequently further changes in the level of the input signal do not have any effect on the output signals. The latter maintain their level until the digital circuit is set to the deactivated state again, whereby a resetting of the output signals to the first logic level takes place.

The invention has the advantage that the setting of the first switching element to the non-conducting state takes place at the optimum time, since it is carried out on the basis of the change in level of the output signals. Consequently, it is immaterial how much time passes between the activation of the digital circuit and the output of the level of the input signal in a non-inverted or inverted form. There is consequently no longer any necessity to measure this time period and reproduce it by a transport delay unit that could alternatively be used for the blocking of the first switching element. Since the digital circuit carries out the blocking of its first switching element in an automatic and time-optimized manner, there is no longer any necessity for such a transport delay unit and the associated development effort with respect to its dimensioning.

According to a development of the invention, the digital circuit has a holding unit with a feedback branch, which prevents any change in the levels at the outputs of the circuit after the blocking of the first switching element for as long as the circuit is activated. In addition, it has a second switching element, which is disposed in the feedback branch and has a control input, which is connected to the output of the logic unit. The logic unit blocks the second switching element when the first logic level is present at both outputs of the circuit, while it switches the second switching element to the conductive state when the second logic level is present at one of the two outputs.

The first switching element and the second switching element are consequently respectively set to opposite switching states. It is ensured by the second switching element that the feedback branch, and consequently the holding unit, is only active when the two outputs of the digital circuit already have different levels. Only then is the first switching element blocked, so that the input signal no longer has any influence on the levels of the output signals. By closing the second switching element, the state of the output signals is held. However, as long as the first switching element is switched to be conducting, the second switching element is blocked, so that no leakage currents flow via the then interrupted feedback branch. Consequently, the power consumption of the digital circuit is reduced.

In accordance with an added feature of the invention, the circuit unit has a holding unit with a feedback branch which prevents any change in the levels at the two output points after switching the switching element to the non-conducting state for as long as the activated state is set. The holding unit has a further switching element with a control input disposed in the feedback branch and the control input is connected to the output of the logic unit. The logic unit switches the further switching element to the non-conducting state if the first logic level is present at both of the output points. The logic unit switches the further switching element to the conducting state if the second logic level is present at one of the two output points.

In accordance with another feature of the invention, the circuit unit, includes an inverter having an input connected to the switching element; a first NAND gate having a first input connected to the inverter, a second input connected to the activation input, and an output being the first output point; and a second NAND gate having a first input connected directly to the switching element, a second input connected to the activation input, and an output being the second output point.

In accordance with a further feature of the invention, the logic unit has a NOR gate.

In accordance with a concomitant feature of the invention, the feedback branch is disposed between the first output point and the input of the inverter.

Other features which are considered as characteristic for the invention are set forth in the appended claims.

Although the invention is illustrated and described herein as embodied in a digital circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a circuit diagram of a second embodiment of the circuit; and

FIG. 4 is a circuit diagram of a third embodiment of the circuit.

DESCRIPTION OF THE PREFERRED EMBODIMENTS

Figure 1:
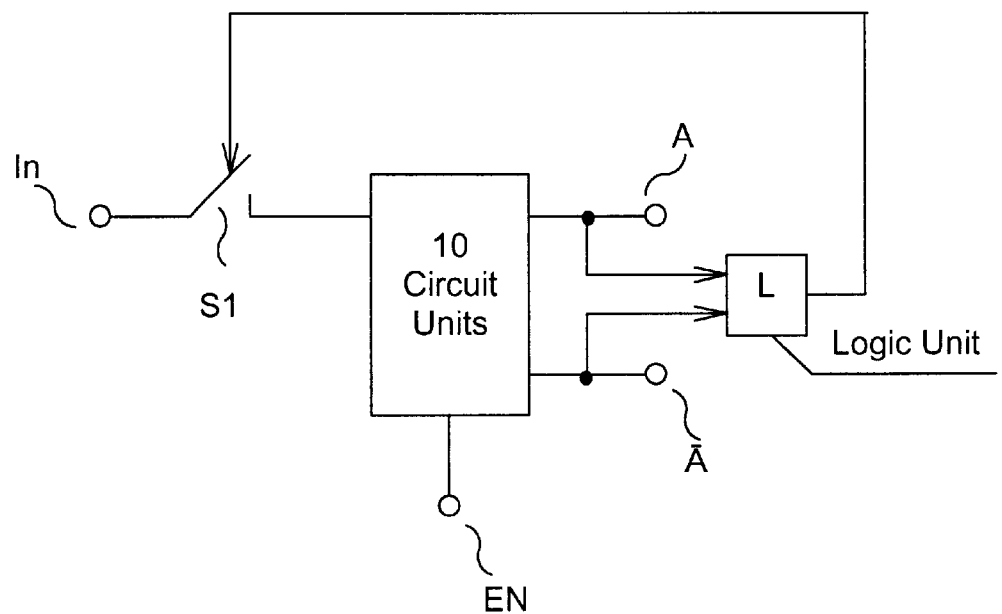
FIG. 1 is a block diagram of a digital circuit according to the invention.

In all the figures of the drawing, sub-features and integral parts that correspond to one another bear the same reference symbol in each case. Referring now to the figures of the drawing in detail and first, particularly, to FIG. 1 thereof, there is shown a digital circuit with an input In and two outputs A, /A. The circuit has circuit units 10, to which an input signal is supplied via the input In and a first switching element S1 connected downstream of the latter. The circuit units 10 are connected to an activation input EN, via which the circuit can be set to an activated state and a deactivated state. While the circuit units 10 output a first logic level at the two outputs A, /A in the deactivated state of the digital circuit, a logic unit L, which is connected to the two outputs, provides that the first switching element S1 is switched to a conductive state. If the digital circuit is activated, the level of the input signal is present in a non-inverted form at the first output A and in an inverted form at the second output /A. The logic unit L detects the state of the output signals and, in response, sets the first switching element S1 to a non-conducting state (blocking). Therefore, subsequent changes in the level of the input signal at the input In no longer have any effect on the circuit units 10 and consequently on the level of the output signals at the outputs A, /A.

Figure 2:
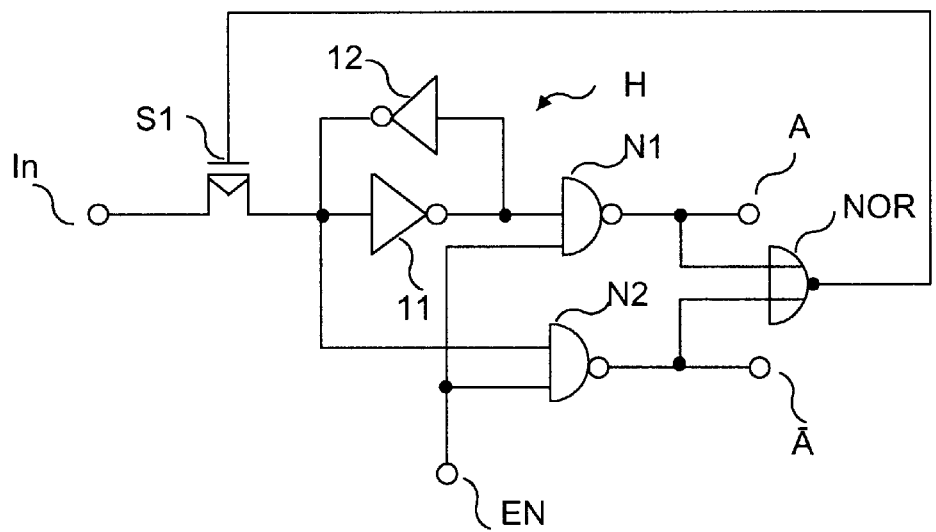
FIG. 2 is a circuit diagram of a first embodiment of the digital circuit.

FIG. 2 shows an actual exemplary embodiment of the digital circuit from FIG. 1. The first switching element S1 is realized by a p-channel transistor. The logic unit L is realized by a NOR gate. The input In is connected via the first switching element S1 and a first inverter I1 to a first input of a first NAND gate N1. Furthermore, the input In is connected via the first switching element S1 to a first input of a second NAND gate N2. Second inputs of the two NAND gates N1, N2 are connected to the activation input EN. The outputs of the two NAND gates N1, N2 are the outputs A, /A of the digital circuit. The output of the first inverter I1 is connected via a feedback branch, which has a second inverter I2, to its input. The two inverters I1, I2 form a holding circuit H.

The operating mode of the circuit shown in FIG. 2 is now described. As long as an activation signal at the activation input EN has a low logic level, a high logic level (logic one) is established at the outputs A, /A, irrespective of the level of the input signal at the input In. At the output of the NOR gate, a low logic level (logic zero) is obtained, so that the first switching element S1 is switched to a conductive state. The input signal at the input In is consequently supplied to the input of the first inverter I1 and to the first input of the second NAND gate N2. In the deactivated state of the digital circuit, the potential at the input of the first inverter I1 is determined primarily by the input signal, since drivers (not represented) of the input signal are dimensioned such that they are stronger than the second inverter I2. As soon as the activation signal at the activation input EN changes to the high logic level, the digital circuit is set to its active state. The levels present at the input and at the output of the first inverter I1 at this point in time have the effect that either the level at the first output A changes from 1 to 0 or the level at the second output /A changes from 1 to 0. As soon as the NOR gate detects this change in level, its output signal changes from 0 to 1, so that the first switching element S1 is blocked. The digital circuit is consequently decoupled from its input In, so that subsequent level changes of the input signal no longer have any effect on the level of the output signals. The holding unit H provides that the level of the input signal present at the input of the first inverter I1 directly before the blocking of the first switching element S1 is held.

FIG. 3 shows a second exemplary embodiment of the digital circuit from FIG. 1, which differs from the exemplary embodiment from FIG. 2 as follows. The first switching element S1 is a transfer gate, which has an n-channel transistor and a p-channel transistor. Connected downstream of the NOR gate is a third inverter I3. At the output of the NOR gate, the latter generates a signal B, which is present at the output of the third inverter I3 as inverted signal /B. The p-channel transistor of the first switching element S1 is connected to the output of the NOR gate and the n-channel transistor is connected to the output of the third inverter I3. Furthermore, the holding unit H has in its feedback branch between the output of the second inverter I2 and the input of the first inverter I1 a second switching element S2, which is likewise a transfer gate. The p-channel transistor of the element is connected to the output of the third inverter I3 and the n-channel transistor of the element is connected to the output of the NOR gate. As a result, the second switching element S2 is always blocked whenever the first switching element S1 is conductive. In addition, the second switching element S2 is always conductive whenever the first switching element S1 is blocked. The second switching element S2 prevents a leakage current between the output of the second inverter I2 and the drivers of the input signal at the input In, since the two switching elements S1, S2 are never switched to be conductive at the same time. The holding function of the holding unit H is only necessary when the first switching element S1 is blocked.

FIG. 4 shows a further exemplary embodiment of the digital circuit from FIG. 1. This differs from the exemplary embodiment from FIG. 3 with regard to the input of the feedback branch of the holding unit H. In FIG. 4, the feedback branch connects the output of the first NAND gate N1 via the second switching element S2 to the input of the first inverter I1. During the deactivated state of the digital circuit, the high logic level 1 is always present at the first output A. Since the second switching element S2 is then blocked, this level does not have any effect on the potential at the input of the first inverter I1. The exemplary embodiment from FIG. 4 has the advantage over that in FIG. 3 that the second inverter I2 is no longer needed. Consequently, the circuit from FIG. 4 can be realized with fewer circuit components than that in FIG. 3.

I claim:

1. A digital circuit, comprising:
    a switching element having a control terminal;
    an input for receiving an input signal and connected to said switching element, said input supplying the input signal to said switching element;
    an activation input receiving an activation signal for setting an activated state and a deactivated state;
    two output points including a first output point and a second output point;
    a logic unit having inputs connected to said two output points and an output connected to said control terminal of said switching element, said logic unit switching said switching element to a conducting state if there is a first logic level at said two output points, said logic unit switching said switching element to a non-conducting state if there is a second logic level at one of said two output points; and
    a circuit unit connected to said activation input, said switching element, and said inputs of said logic unit;
    in the activated state, said first output point outputs in a non-inverted form a level of the input signal which the input signal has directly before the setting of said switching element to the non-conducting state, in the activated state, said second output point outputs in an inverted form the level of the input signal which the input signal has directly before the setting of said switching element to the non-conducting state, and in the deactivated state, the first logic level is output at both of said two output points.

2. The digital circuit according to claim 1, wherein:
    said circuit unit has a holding unit with a feedback branch which prevents any change in the levels at said two output points after switching said switching element to the non-conducting state for as long as the activated state is set;
    said holding unit has a further switching element with a control input disposed in said feedback branch and said control input is connected to said output of said logic unit;
    said logic unit switches said further switching element to the non-conducting state if the first logic level is present at both of said output points; and
    said logic unit switches said further switching element to the conducting state if the second logic level is present at one of said two output points.

3. The digital circuit according to claim 1, wherein:
    said circuit unit, including:
        an inverter having an input connected to said switching element;
        a first NAND gate having a first input connected to said inverter, a second input connected to said activation input, and an output being said first output point; and
        a second NAND gate having a first input connected directly to said switching element, a second input connected to said activation input, and an output being said second output point.

4. The digital circuit according to claim 3, wherein said logic unit has a NOR gate.

5. The digital circuit according to claim 3, wherein said feedback branch is disposed between said first output point and said input of said inverter.

* * * * *

UNITED STATES PATENT AND TRADEMARK OFFICE
CERTIFICATE OF CORRECTION

PATENT NO. : 6,369,607 B2
DATED : April 9, 2002
INVENTOR(S) : Le Thoai-Thai

It is certified that error appears in the above-identified patent and that said Letters Patent is hereby corrected as shown below:

<u>Title page,</u>
Item [30], should read as follows:
-- September 9, 1998    [DE] ……………….. 198 41 203.7 --

Signed and Sealed this

Twenty-fourth Day of September, 2002

*Attest:*

*Attesting Officer*

JAMES E. ROGAN
*Director of the United States Patent and Trademark Office*